United States Patent
Kirby et al.

(10) Patent No.: US 9,917,002 B2
(45) Date of Patent: Mar. 13, 2018

(54) SEMICONDUCTOR WITH THROUGH-SUBSTRATE INTERCONNECT

(71) Applicant: Micron Technology, Inc., Boise, ID (US)

(72) Inventors: Kyle K. Kirby, Eagle, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/369,089

(22) Filed: Dec. 5, 2016

(65) Prior Publication Data

US 2017/0213760 A1    Jul. 27, 2017

Related U.S. Application Data

(60) Continuation of application No. 14/755,274, filed on Jun. 30, 2015, now Pat. No. 9,514,975, which is a (Continued)

(51) Int. Cl.
*H01L 21/74* (2006.01)
*H01L 21/768* (2006.01)
(Continued)

(52) U.S. Cl.
CPC ...... *H01L 21/743* (2013.01); *H01L 21/26513* (2013.01); *H01L 21/76802* (2013.01);
(Continued)

(58) Field of Classification Search
CPC .......... H01L 21/743; H01L 21/26513; H01L 21/76802; H01L 21/76831;
(Continued)

(56) References Cited

U.S. PATENT DOCUMENTS

| | | |
|---|---|---|
| 5,173,442 A | 12/1992 | Carey |
| 6,107,186 A | 8/2000 | Erb |

(Continued)

FOREIGN PATENT DOCUMENTS

| | | |
|---|---|---|
| KR | 20050073372 A | 7/2005 |
| TW | 200539244 A | 12/2005 |

(Continued)

OTHER PUBLICATIONS

Kurita, Y. et al., A 3D Stacked Memory Integrated on a Logic Device Using SMAFTI Technology, 2007 IEEE Electronic Components and Technology Conference, pp. 821-829, May 29-Jun. 1, 2007, ISBN 1-4244-0985-3.

(Continued)

*Primary Examiner* — Yasser A Abdelaziez
(74) *Attorney, Agent, or Firm* — Perkins Coie LLP

(57) ABSTRACT

Semiconductor devices are described that have a metal interconnect extending vertically through a portion of the device to the back side of a semiconductor substrate. A top region of the metal interconnect is located vertically below a horizontal plane containing a metal routing layer. Method of fabricating the semiconductor device can include etching a via into a semiconductor substrate, filling the via with a metal material, forming a metal routing layer subsequent to filling the via, and removing a portion of a bottom of the semiconductor substrate to expose a bottom region of the metal filled via.

21 Claims, 17 Drawing Sheets

Related U.S. Application Data division of application No. 13/850,840, filed on Mar. 26, 2013, now Pat. No. 9,099,457, which is a division of application No. 13/160,363, filed on Jun. 14, 2011, now Pat. No. 8,404,587, which is a division of application No. 12/142,251, filed on Jun. 19, 2008, now Pat. No. 7,968,460.

(51) Int. Cl.
    *H01L 21/265*    (2006.01)
    *H01L 29/66*     (2006.01)

(52) U.S. Cl.
    CPC .. *H01L 21/76831* (2013.01); *H01L 21/76877* (2013.01); *H01L 21/76895* (2013.01); *H01L 21/76898* (2013.01); *H01L 29/66568* (2013.01)

(58) Field of Classification Search
    CPC ......... H01L 21/76877; H01L 21/76895; H01L 21/76898; H01L 29/66568
    See application file for complete search history.

(56) References Cited

U.S. PATENT DOCUMENTS

| | | |
|---|---|---|
| 6,221,769 B1 | 4/2001 | Dhong et al. |
| 6,455,425 B1 | 9/2002 | Besser et al. |
| 6,582,992 B2 | 6/2003 | Poo et al. |
| 6,903,443 B2 | 6/2005 | Farnworth et al. |
| 6,962,867 B2 | 11/2005 | Jackson et al. |
| 7,091,124 B2 | 8/2006 | Rigg et al. |
| 7,111,149 B2 | 9/2006 | Eilert |
| 7,317,256 B2 | 1/2008 | Williams et al. |
| 7,449,098 B1 | 11/2008 | Mayer et al. |
| 7,745,931 B2 | 6/2010 | Takao |
| 8,836,109 B2 * | 9/2014 | Yun ...................... H01L 23/481 257/700 |
| 2002/0020862 A1 | 2/2002 | Livengood et al. |
| 2002/0064729 A1 | 5/2002 | Ching et al. |
| 2003/0113967 A1 | 6/2003 | Allman et al. |
| 2003/0234416 A1 | 12/2003 | Thomas et al. |
| 2004/0048459 A1 | 3/2004 | Patti |
| 2004/0121521 A1 | 6/2004 | Jackson et al. |
| 2005/0001326 A1 | 1/2005 | Masuda |
| 2005/0009333 A1 | 1/2005 | Lee et al. |
| 2005/0029630 A1 | 2/2005 | Matsuo |
| 2006/0046461 A1 | 3/2006 | Benson et al. |
| 2006/0246699 A1 | 11/2006 | Weidman et al. |
| 2006/0258111 A1 | 11/2006 | Jagueneau et al. |
| 2006/0270196 A1 | 11/2006 | Kirby |
| 2007/0048896 A1 | 3/2007 | Andry et al. |
| 2007/0049996 A1 | 3/2007 | Black et al. |
| 2007/0063240 A1 | 3/2007 | Torres et al. |
| 2007/0178694 A1 | 8/2007 | Hiatt |
| 2008/0164573 A1 | 7/2008 | Basker et al. |
| 2008/0299759 A1 | 12/2008 | Chatterjee et al. |
| 2008/0299762 A1 | 12/2008 | Mathew et al. |
| 2008/0318361 A1 | 12/2008 | Han et al. |
| 2009/0008790 A1 | 1/2009 | Lee et al. |
| 2009/0091962 A1 | 4/2009 | Chung et al. |
| 2009/0124072 A1 | 5/2009 | Park et al. |
| 2009/0127668 A1 | 5/2009 | Choi |
| 2009/0152602 A1 | 6/2009 | Akiyama |
| 2009/0180257 A1 | 7/2009 | Park et al. |
| 2009/0191708 A1 * | 7/2009 | Kropewnicki .... H01L 21/76898 438/667 |
| 2009/0224405 A1 | 9/2009 | Chiou et al. |
| 2009/0239375 A1 | 9/2009 | Riess et al. |
| 2009/0278237 A1 | 11/2009 | Cooney, III et al. |
| 2009/0294983 A1 | 12/2009 | Cobbley et al. |
| 2009/0315154 A1 | 12/2009 | Kirby et al. |
| 2011/0042821 A1 | 2/2011 | Kirby et al. |
| 2011/0241205 A1 | 10/2011 | Kirby et al. |
| 2013/0221446 A1 | 8/2013 | Kirby et al. |
| 2015/0303095 A1 | 10/2015 | Kirby et al. |

FOREIGN PATENT DOCUMENTS

| | | |
|---|---|---|
| TW | I245379 B | 12/2005 |
| TW | 200821636 A | 5/2008 |
| WO | WO2005101476 | * 10/2005 |

OTHER PUBLICATIONS

Office Action issued in Taiwan Application No. 098117132, 13 pages.
Office Action issued May 15, 2014 in Taiwan Application No. 099126998, 15 pages.
U.S. Appl. No. 12/545,196, filed Aug. 21, 2009, to Kirby et al.
U.S. Appl. No. 12/701,800, filed Feb. 8, 2010, to Kirby et al.

* cited by examiner

US 9,917,002 B2

SEMICONDUCTOR WITH THROUGH-SUBSTRATE INTERCONNECT

CROSS-REFERENCE TO RELATED APPLICATIONS

This application is a continuation of U.S. application Ser. No. 14/755,274 filed Jun. 30, 2015, which is a divisional of U.S. application Ser. No. 13/850,840 filed Mar. 26, 2013, which is a divisional of U.S. application Ser. No. 13/160,363 filed Jun. 19, 2008, now U.S. Pat. No. 8,404,587, which is a divisional of U.S. application Ser. No. 12/142,251 filed Jun. 19, 2008, now U.S. Pat. No. 7,968,460, each of which is incorporated herein by reference in its entirety.

TECHNICAL FIELD

The present disclosure relates generally to semiconductor devices. In particular, the present disclosure relates to conductive interconnects in semiconductor devices.

BACKGROUND

During fabrication of semiconductor devices a wafer of base material, such as crystalline silicon, is used to form electrical components. The process steps to form the semiconductor device are generally additive or subtractive steps. These can include, but are not limited to, growing materials, depositing materials, implanting ions, planarizing a surface, and etching material. These processes are performed on the wafer which is then singulated into separate semiconductor die. Each die includes an active surface, or top surface, where the process steps are performed to form the electrical devices, and a back surface.

After singulation, the semiconductor die can be packaged for use in other devices, such as consumer electronic products. Several methods have been used to form electrical connections with the semiconductor active surface, such as wire bonding and ball bonding. As an example, one process for packaging a semiconductor die includes (a) forming dice on a semiconductor wafer, (b) cutting the wafer to separate or singulate the dice, (c) attaching individual die to an interposer substrate, (d) wire-bonding conductive bond-pads of the active surface of the die to terminals of the interposer substrate, and (e) encapsulating the die with a suitable moulding compound.

In response to the desire to increase the density of semiconductor devices for a given footprint, semiconductor manufacturers have worked to develop ways to stack one or more devices on top of another. Different methods for electrically connecting the semiconductor die together have been described. These methods can include forming back side conductive interconnect locations. Some examples of backside interconnects are described in U.S. Pat. Nos. 6,582,992, 6,903,443, 6,962,867 and 7,091,124.

For example, the U.S. Pat. No. 7,091,124 describes forming vias or passages through a die and a bond-pad on an active surface of the die to a back side of the die. The U.S. Pat. No. 6,962,867 describes a semiconductor substrate including one or more vias having conductive material formed therein and which extend from an active surface to a back surface of the semiconductor substrate. A method for fabricating semiconductor components and interconnects, described in the U.S. Pat. No. 6,903,443 includes the steps of providing a substrate, such as a semiconductor die, forming external contacts on opposing sides of the substrate by laser drilling vias through the substrate, and forming conductive members in the vias. The U.S. Pat. No. 6,582,992 describes conductive grooves formed on the edges of a die that function as interlevel conductors for a stacked die package.

Forming vias after the semiconductor processing is substantially complete can be referred to as a via-last process. In contrast, some development work has been done to form the via prior to integration processing, a via-first process. For example, a polysilicon via process was disclosed in "A 3D Stacked Memory Integrated on a Logic Device Using SMAFTI Technology," Kurita, et al., 2007 Electronic Components and Technology Conference, pages 821-829. The paper describes a via-first process with a highly doped poly-Si as the filling material for through silicon vias in DRAM dice. The Si substrate etching and filling are carried out before the DRAM device process in the via-first process. The paper indicates that the choice of poly-Si as the filling material can prevent metal atom contamination and temperature restriction in the device process that follow. As described in the paper, a trench is etched into a silicon substrate and the trench side-wall is isolated with thermal oxide. Poly-Si is deposited by Chemical Vapor Deposition (CVD) and the silicon surface is planarized with Chemical Mechanical Polishing (CMP) to remove excess layers at the top surface. A DRAM device process is then carried out on the wafer.

For reasons which will become apparent to those skilled in the art upon reading and understanding the present specification, there is a need in the art for alternative methods and devices that provide back side conductive interconnect locations for semiconductor devices.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, chemical, or electrical changes may be made without departing from the scope of the present disclosure. The terms wafer and substrate used previously and in the following description include any base semiconductor structure. Furthermore, when reference is made to a wafer or substrate in the following description, previous process steps may have been utilized to form regions/junctions in the base semiconductor structure. In addition, directional references, e.g., upper, lower, top, bottom and sides, are relative to one another and need not refer to an absolute direction. The following detailed description is, therefore, not to be taken in a limiting sense.

The present disclosure describes semiconductor processes that incorporate metal conductive interconnects into the fabrication process of an integrated circuit. As explained in greater detail below, the processes allow for the formation of metal filled vias during the fabrication of the semiconductor. The vias are formed and filled subsequent to transistor formation and prior to the fabrication of metal routing layers. Numerous benefits are achieved by the disclosed embodiments of the present invention, including tighter pitch via formation, lower resistance than poly-Si interconnects, and an improved integration into semiconductor fabrication operations.

Figure 1:
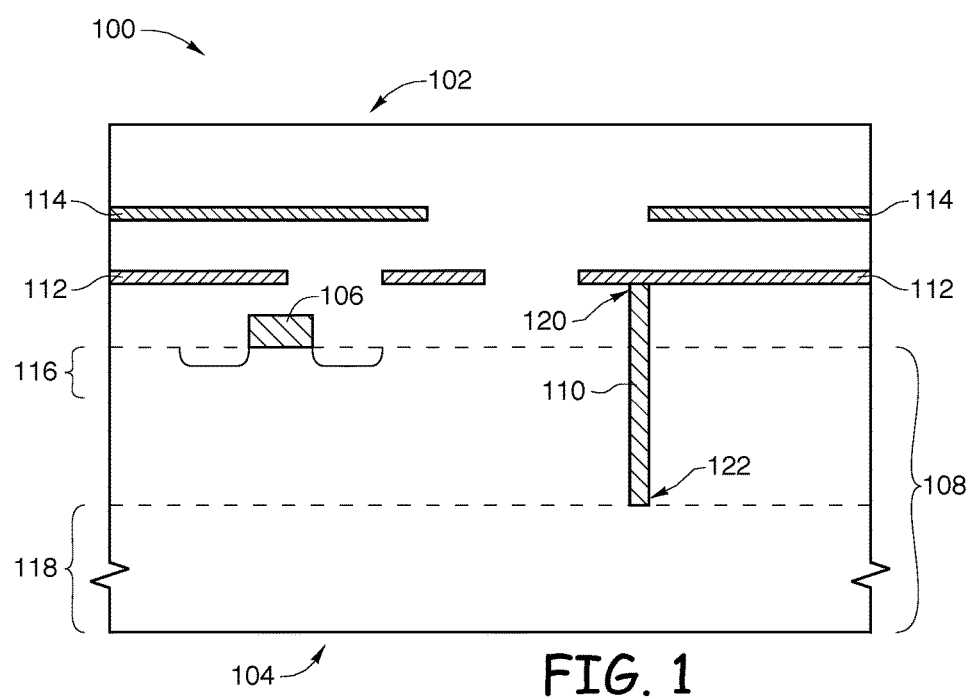
FIG. 1 is a partial cross-section representation of a simplified semiconductor device according to one embodiment of the invention.

Referring to the illustrated cross-sectioned representation of a simplified semiconductor device 100 in FIG. 1, the semiconductor includes a front side 102 and a back side 104. As known to those skilled in the art, electronic devices 106 are fabricated on and/or in a substrate 108 generally on the top, or active, side of the semiconductor substrate. As described in detail below, a metal interconnect 110 is fabricated into the substrate 108 at a time in the semiconductor fabrication process after formation of some electronic devices 106, such as transistors, but prior to fabrication of some metal routing layers 112 and 114. Some semiconductor devices, such as dynamic random access memories (DRAM), include multiple metal routing layers. These layers are often referred to as Metal 1 to Metal N, where Metal 1 is the first metal layer formed. Because the metal interconnect extends below an active region 116 of the substrate it can be accessed by removing a portion of the back surface 118 of the semiconductor device. It is noted that a top region 120 of the metal interconnect 110 is terminated in a horizontal plane located below a plane of the Metal N layer 114. A bottom region 122 of the metal interconnect is exposed through the semiconductor substrate 108 (after section 118 is removed) to provide an electrical path through the substrate. The illustration of FIG. 1 has been simplified to focus on the location of the metal interconnect relative to the routing layer. Those skilled in the art will appreciate that a semiconductor device includes additional circuitry and process fabrication steps that have not been illustrated or descried herein.

Figure 2:
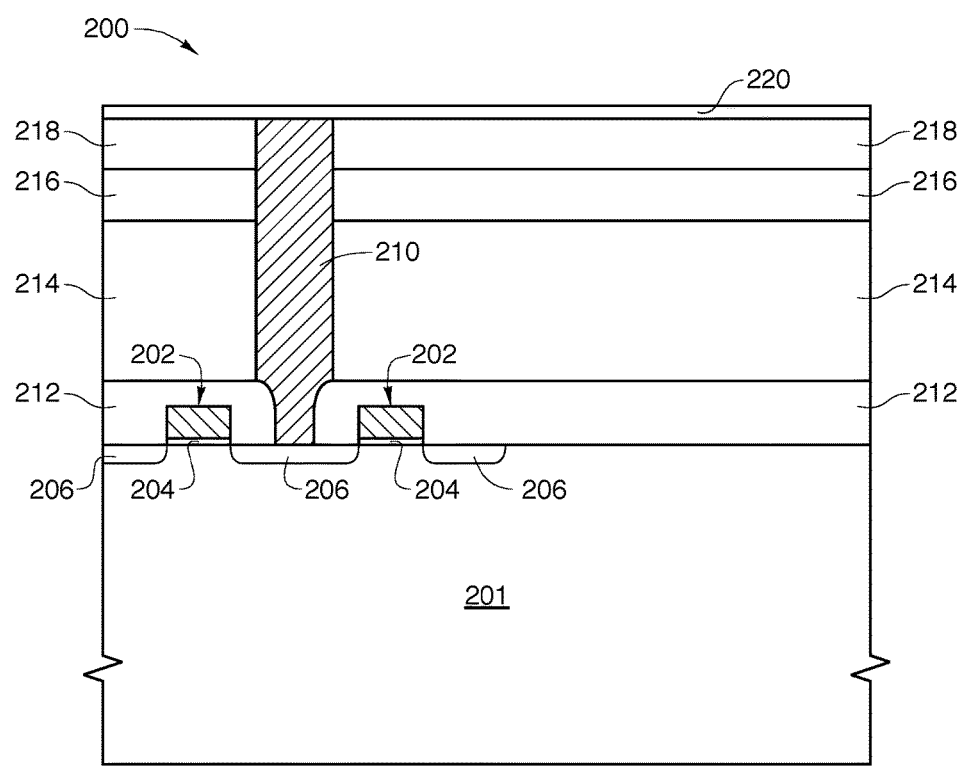
FIGS. 2-14 are partial cross-section views of a simplified in-process semiconductor according to embodiments of the invention.

Referring to FIGS. 2 through 14, integration processes according to embodiments of the present invention are described. FIG. 2 illustrates a cross-section of an in-process semiconductor device 200 fabricated on a silicon substrate 201. The device includes transistors 202 having gates 204 and source/drain implant regions 206. A vertical contact 210 extends through multiple layers of material, such as dielectric layers 212, 214, 216 and 218, to provide an electrical interconnect to a source/drain implant region 206. For purposes of understanding the invention, details of the transistors, multiple dielectric layers and the contact are not required. Further, the present invention is not limited to a specific semiconductor device. For example, the transistors 202 illustrated are planar transistors and embodiments of the invention are equally useful in devices having vertical or three-dimensional transistors. In one embodiment the semiconductor device is a volatile memory, such as a dynamic random access memory (DRAM), and the transistors can be access transistors used to access a charge storage node such as a capacitor (not illustrated).

Figure 3:
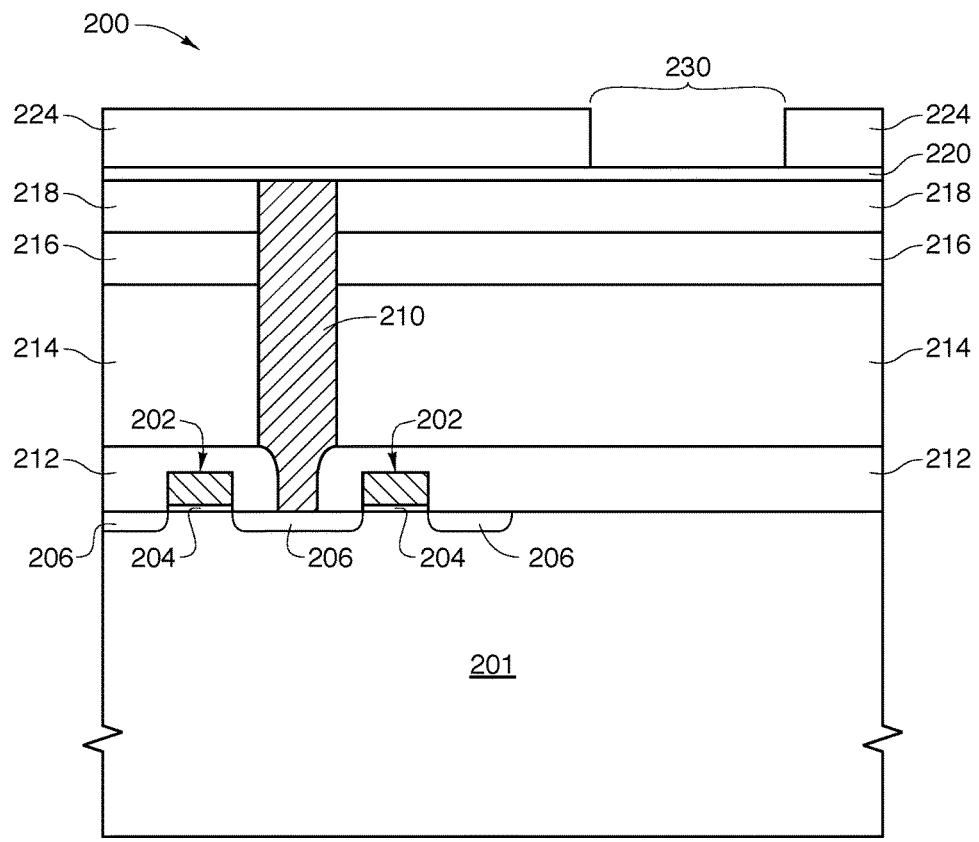

At a fabrication point following formation of the transistors, a low dielectric constant barrier and etch stop film 220, such as BLOk™ material from Applied Materials, Inc., Santa Clara, Calif., is deposited on a top surface of the device. Referring to FIG. 3, a photo resist material 224 is deposited, patterned and selectively removed using well known photo resist processes to provide an opening 230. Because the patterned opening will be used to form conductive vias, the geometric shape of the opening is not critical. In general, the shape as viewed from above (plan view) can be round, oval, square, diamond, rectangular or any other appropriate multi-sided shape.

Figure 4:
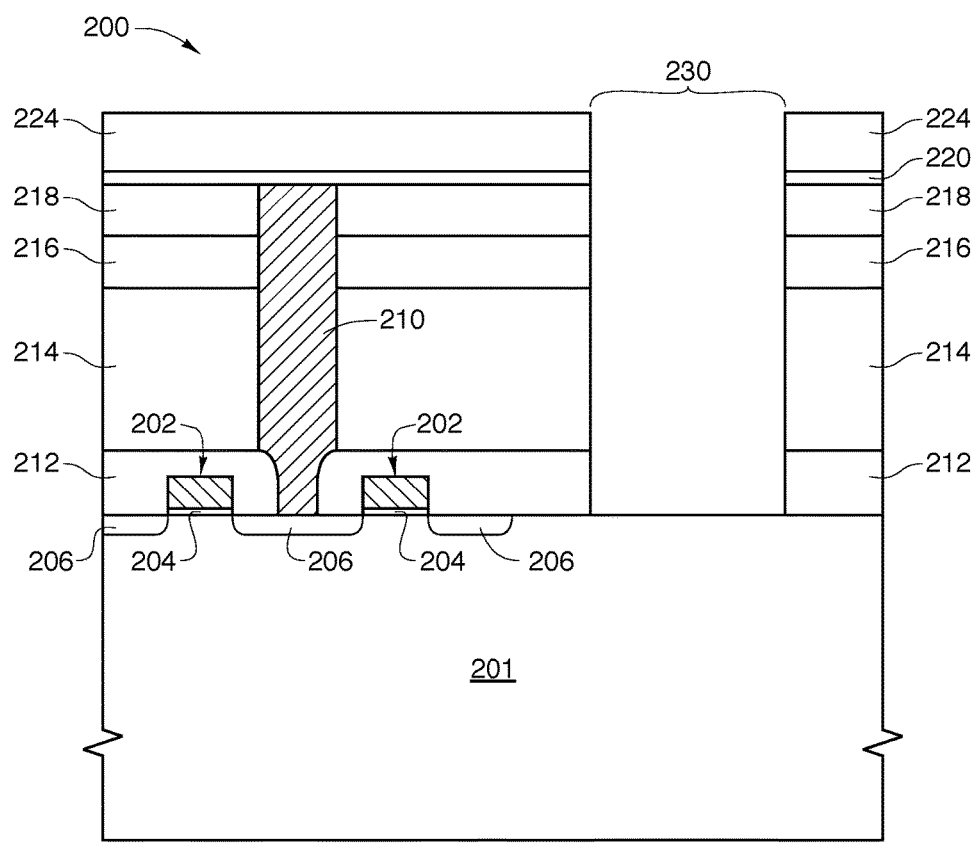
Figure 5:
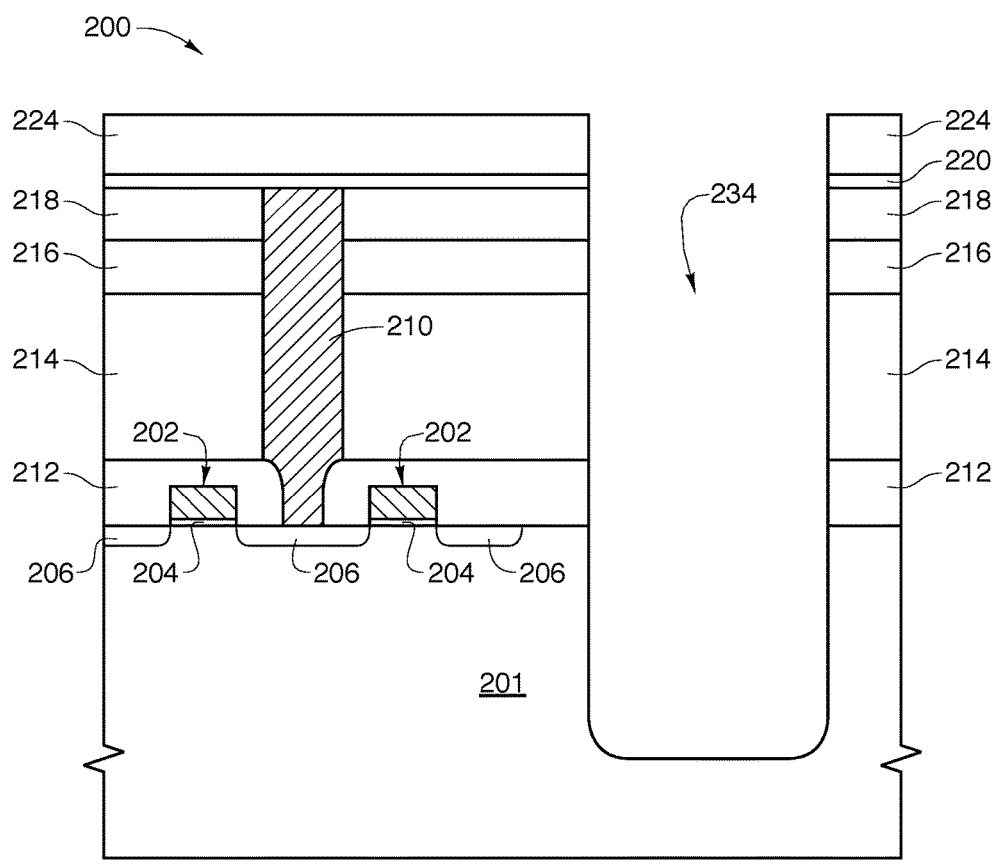

Etch processing is then performed to selectively remove layers of material located between the photo resist 224 and the silicon substrate 201, see FIG. 4. A portion of the silicon substrate 201 is also removed through etching, see FIG. 5, to form via 234 into the silicon substrate. The etching operation may be completed in multiple steps. For example, if the intermediate layers between the photo resist 224 and silicon 201 are oxide layers, an oxide etch can be performed to expose the silicon substrate 201 and then a silicon etch can be performed. Any suitable etch process can be used, including but not limited to: dry etching "Bosch" style, steady state style, cryogenic silicon etch, laser ablation, particle blasting, wet etching, and micro electro discharge machining. In one embodiment the cross sectional width of the via is approximately 10 um and the depth of the silicon etch is between 50 and 100 um. As such an aspect ratio of about 5:1 to 10:1 may be desirable in some embodiments. Actual aspect ratios, however, will be dependent upon the specific semiconductor device being fabricated. The via 234 extends into the silicon substrate to a depth that is below an active region of the top of the substrate. The active region can be considered the region of the silicon substrate containing circuit features, such as dopant implant regions, and regions of the bulk silicon substrate required for proper operation of the semiconductor device.

Figure 6:
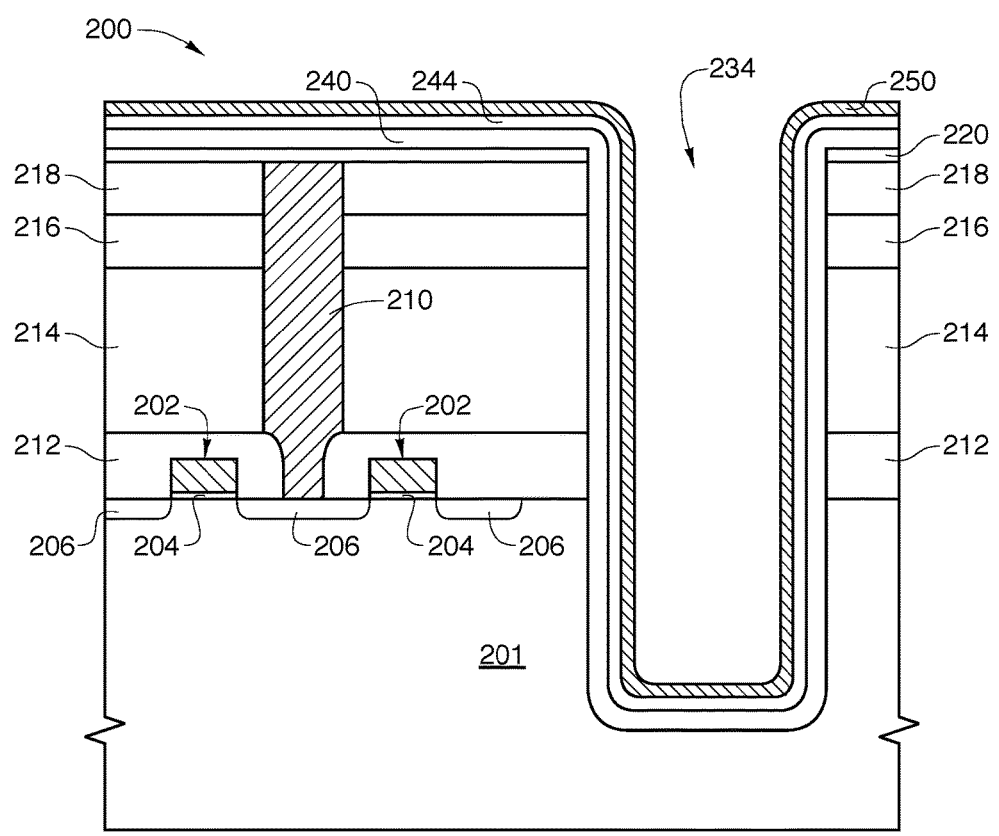

As illustrated in FIG. 6, the photo resist layer 224 is removed and an oxide layer 240 is deposited over the barrier layer 220 and into the etched via 234 following removal of the photo resist. The oxide layer provides a dielectric, or insulation layer between a metal interconnect to be formed in the via and the silicon substrate 201. A second barrier layer 244, such as Ta, W, TiN or TiW or other suitable material, is formed over the oxide 240 and then a metal seed layer 250 is deposited. The metal seed layer in one embodiment is a copper seed layer, in another embodiment the seed layer is Tungsten or other suitable material. For purposes of describing the present invention the detailed description will describe a device using copper as the metal. The term metal as used herein includes materials having overlapping conduction bands and valence bands, including but not limited to metals of the Periodic Table and alloys thereof. Those skilled in the art with the benefit of the present description will appreciate that the invention is not limited to copper embodiments. The seed layer can be formed using techniques such as CVD (Chemical Vapor Deposition), PVD (Physical Vapor Deposition), electro graphing, or plating on the barrier. The seed layer in one embodiment has a general thickness in the range of 2-6 k angstrom.

Figure 7:
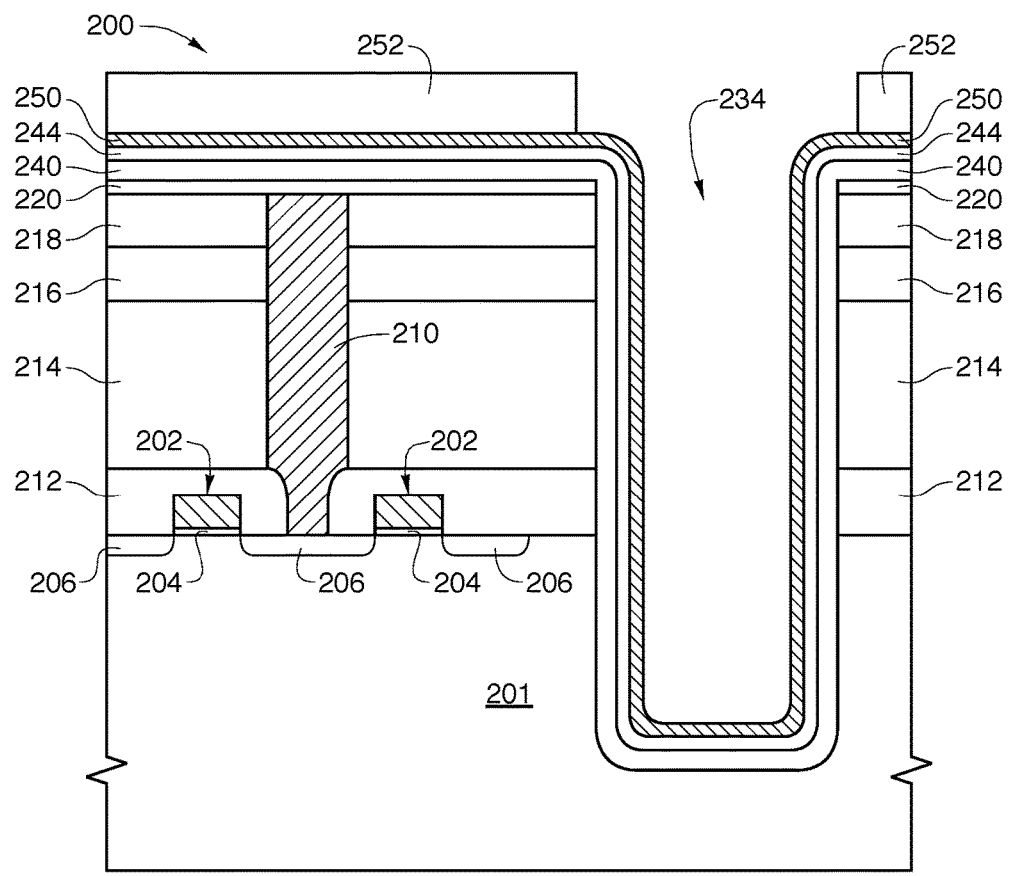

After the seed layer 250 is deposited, a plating mask 252 is fabricated as illustrated in FIG. 7. Any plating mask material that is formed in the etched via is removed to expose the seed layer in via 234. The plating mask can be patterned using either a negative or positive photo resist. It is believed that the negative photo resist material can be more completely removed from the via. Other surface plating inhibitors can be used as the plating mask. For example, stamped on material or sputtered layers such as Ti could be used.

Figure 8:
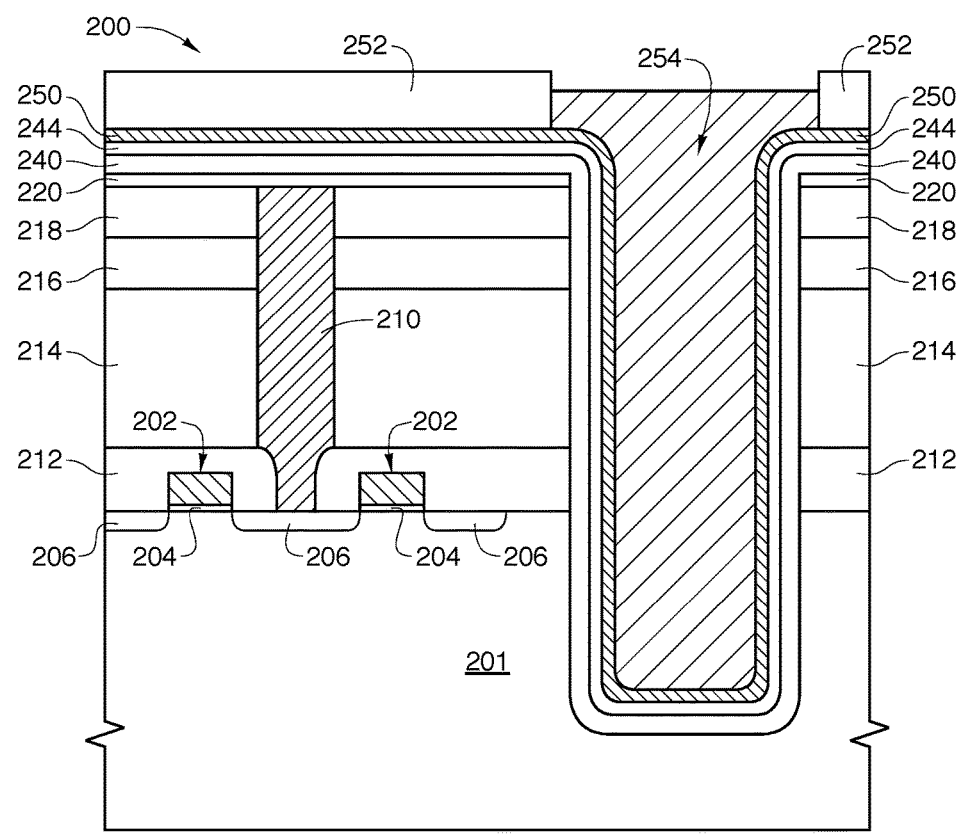

A plating process is then performed to fill the via with solid metal 254, as shown in FIG. 8. For example, a copper plating process is performed to fill the via. In one embodiment a electrochemical deposition (ECD) plating process is used. Other plating processes and materials could be used, such as CVD, PVD, electroless (chemical or auto-catalytic), nano-particle or conductive polymers.

Depending upon the aspect ratio of the via, the plating process may need to be optimized by one skilled in the art to avoid and/or reduce the creation of voids in the metal. It is noted that the plating mask layer 252 limits the plating process to the seed layer exposed in the via. That is the horizontal regions of the seed layer outside the via remain selectively covered to prevent plating.

Figure 9:
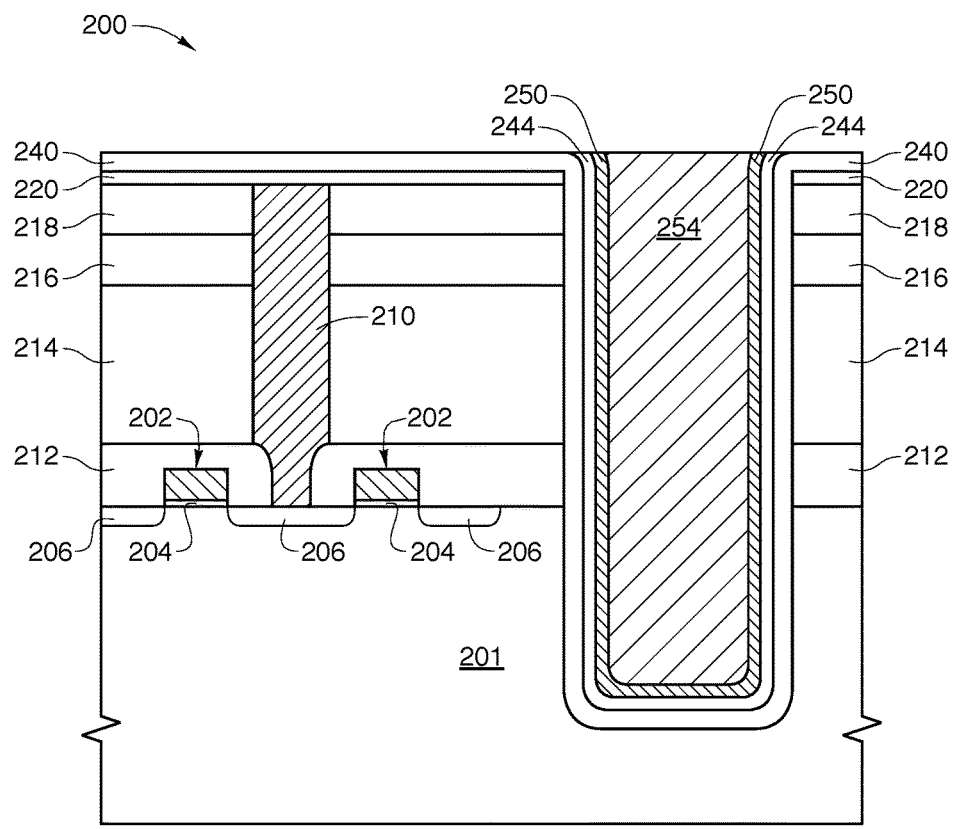
Figure 10:
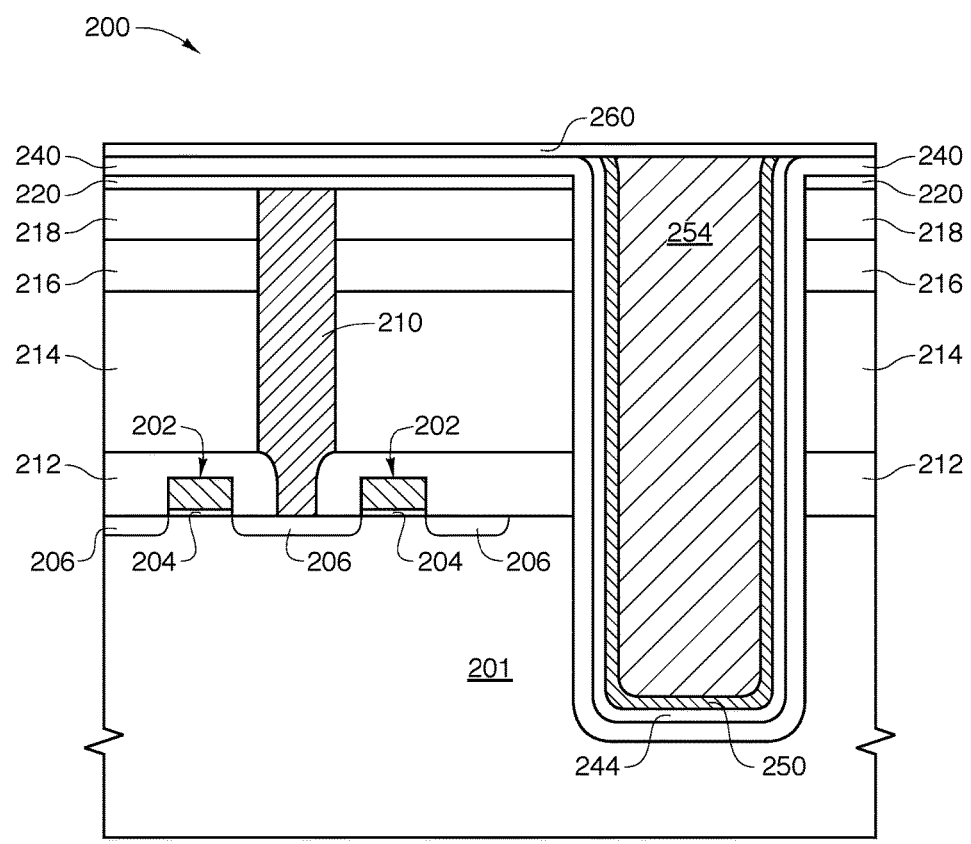

After the plating mask 252 is removed a planarizing process is performed to remove the protected seed layer 250 and plated metal 254 extending vertically above the dielectric layer 240, see FIG. 9. For example, a chemical mechanical planarizing (CMP) operation can be performed that stops on the oxide layer 240. Following the planarization operation an optional capping layer 260 can be formed as illustrated in FIG. 10. The capping layer can be an oxide or other barrier layer to prevent metal migration. This capping layer is particularly useful in helping to contain metal 254 and avoid contamination of fabrication equipment used in subsequent processing operations. For example, it is known that copper is highly mobile and once process equipment is exposed to copper it is often limited to future use in operations employing copper.

Figure 11:
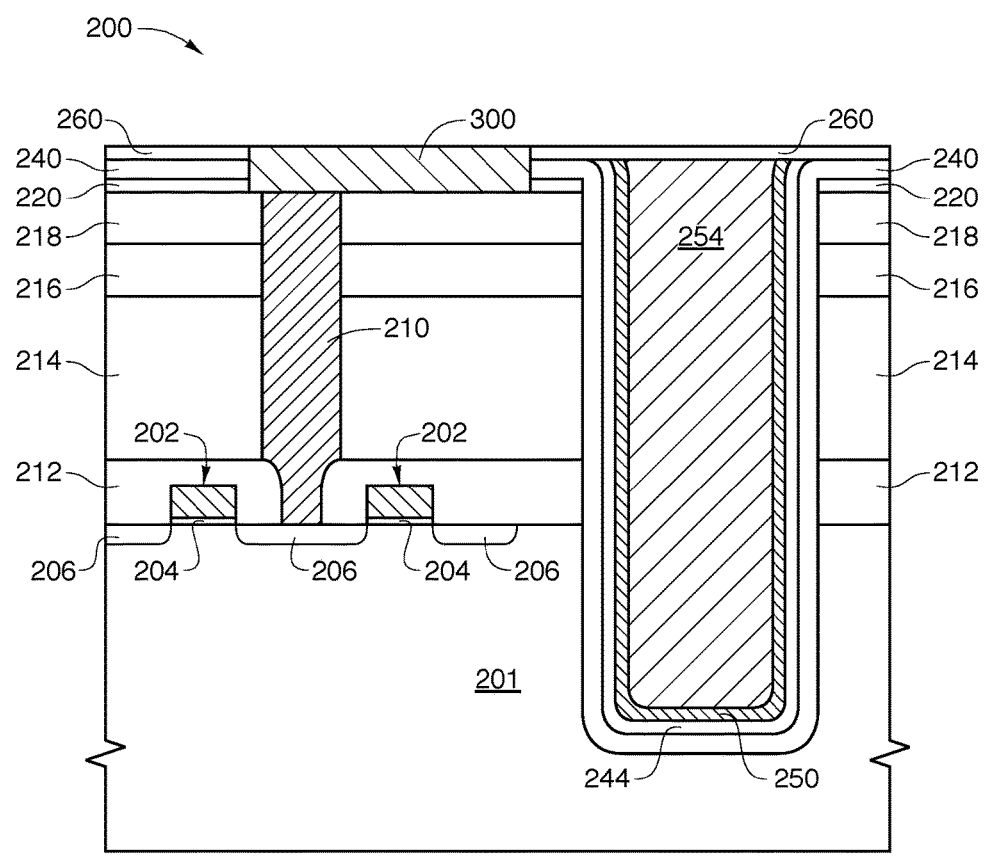
Figure 12:
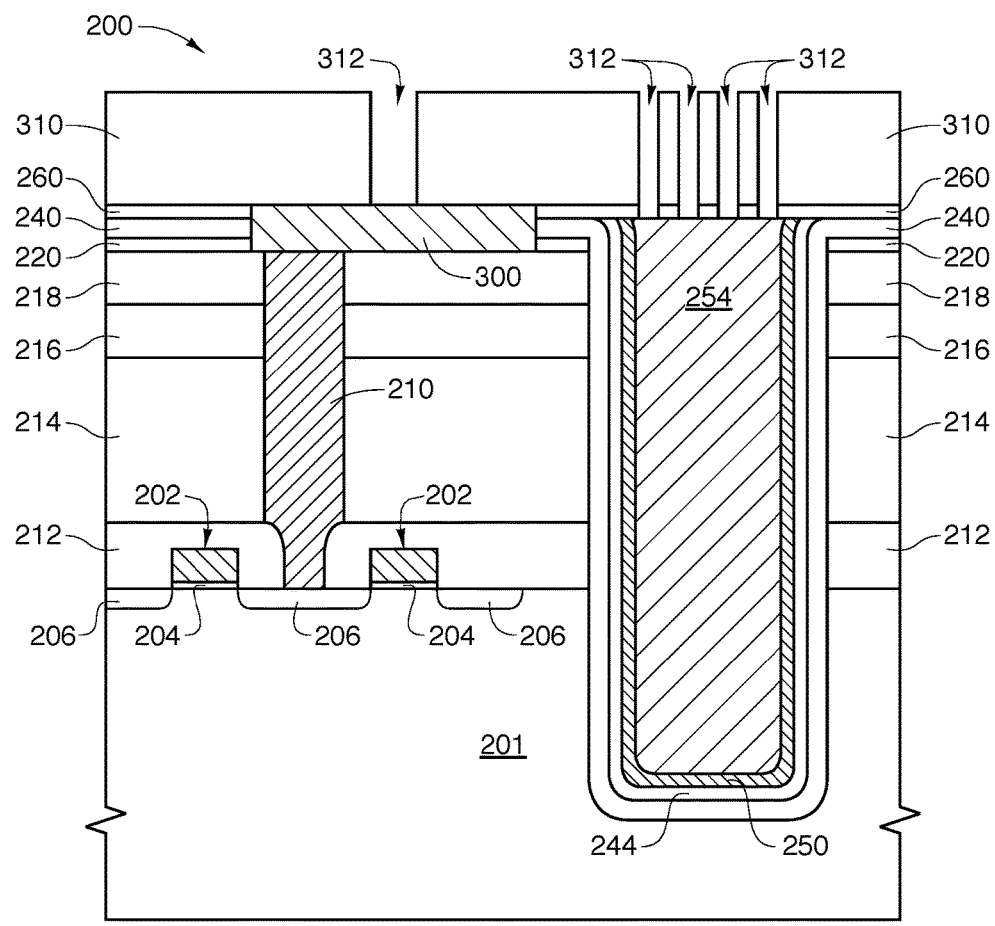

Multiple operations are illustrated as having been completed at the process point in FIG. 11. Specifically, a damascene process is performed on the device by patterning a photo resist (not shown), etching to selectively expose contact 210, forming a metal 1 routing layer 300 in the etched opening, and planarizing the metal 1 layer to a level of the capping layer 260. The metal 1 layer can be fabricated using a second seed layer. In this embodiment a top region of the metal interconnect 254 is generally in the same horizontal plane as the metal 1 layer 300. Referring to FIG. 12, a dielectric layer 310 is formed after the metal 1 layer. Portions of the dielectric layer are then etched to form openings 312 to expose contact regions of the metal 1 routing layer 300 and the metal interconnect 254. The size, shape and number of contact opening to the metal 1 and metal interconnect can vary based upon the needs of the integrated circuit device. As illustrated, one embodiment can include multiple openings for contact to the metal interconnect.

Figure 13:
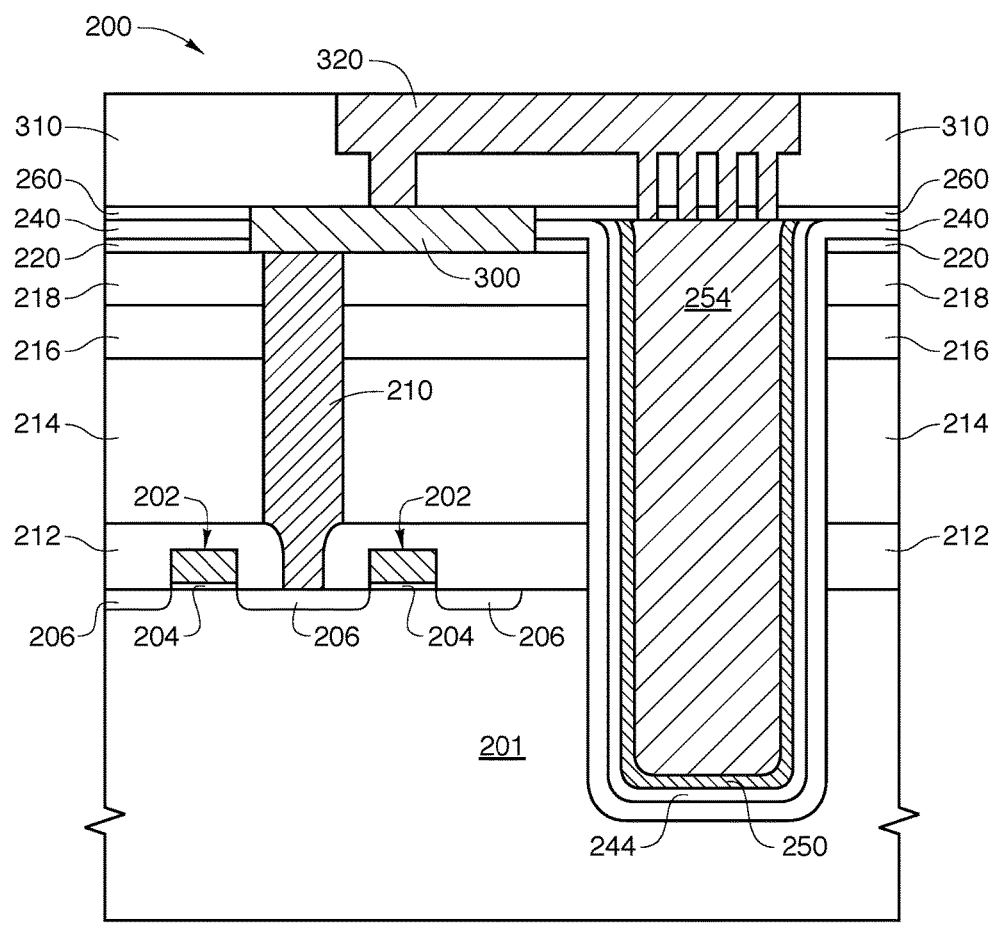
Figure 14:
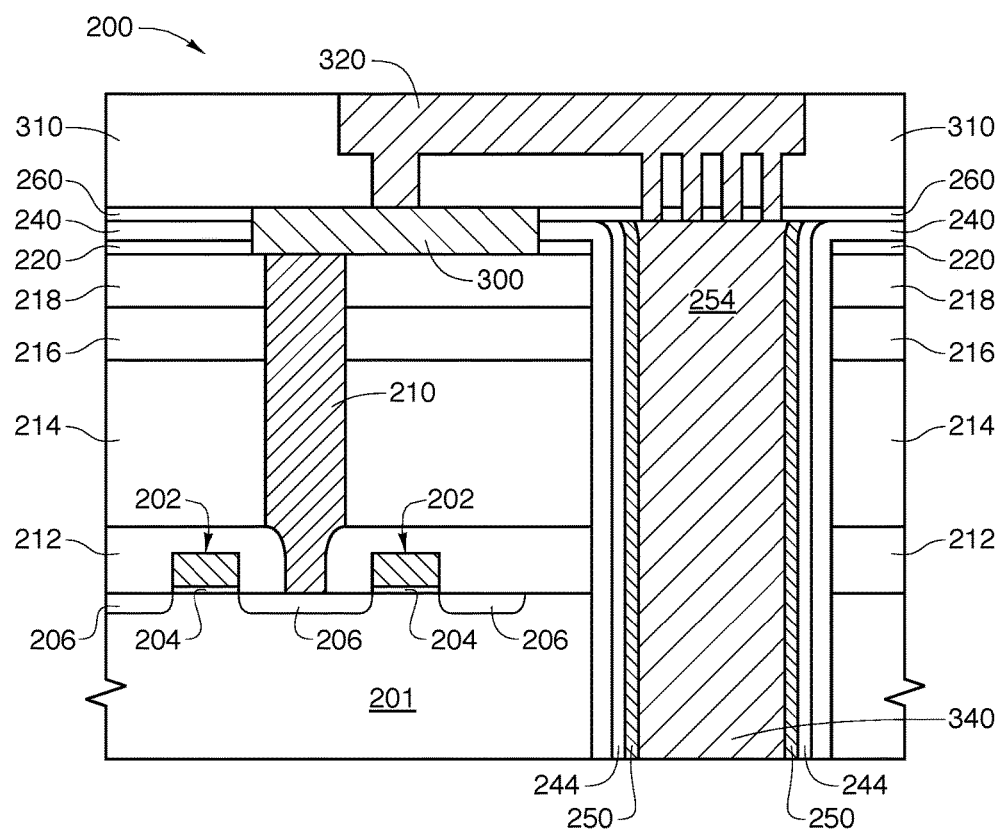

Referring to FIG. 13, a metal 2 routing layer 320 has been formed. It will be appreciated that to form the metal 2 layer a seed layer (not shown) was formed, the seed layer was plated to fill a recess formed in the dielectric layer 310, and a planarizing operation was performed to remove excess metal. The top region of the metal interconnect 254 can be described as being in a horizontal plane that is below a primary horizontal plane of the metal 2 layer 320. That is, although the metal 2 layer contacts the metal interconnect, the primary horizontal plane of the metal 2 routing layer is separated vertically from the conductor by a dielectric region.

Additional process steps, not shown, can be performed above the metal 2 layer, including the formation of additional dielectric and metal routing layers. The semiconductor substrate is thinned using techniques known to those skilled in the art, such as by back grinding, to expose a lower region 340 of the metal interconnect 254, see FIG. 14. A semiconductor device therefore has been formed having a top side and a back side. A first metal layer 300 is located between the top side and the back side, and a second metal layer 320 is located between the first metal layer and the top side. A metal interconnect 254 extends vertically through a portion of the semiconductor device to the back side and a top region of the metal interconnect is located vertically below a horizontal plane containing the second metal layer 320.

In one embodiment the semiconductor device is fabricated by etching a via into a semiconductor substrate, filling the via with a metal material, forming a metal routing layer subsequent to filling the via, and removing a portion of a bottom of the semiconductor substrate to expose a bottom region of the metal filled via. Further embodiments can include fabricating a transistor having a gate and source/drain implant regions extending into a top region of a silicon substrate. A dielectric layer is formed above the transistor and a via is then formed through the dielectric layer and into the silicon substrate laterally adjacent to the transistor. The via vertically extends below source/drain implant regions of the transistor. A first dielectric layer is formed in the etched via and then a metal seed layer is formed after the first dielectric layer. A blocking layer is formed over selected regions of the seed layer located outside of the via and the exposed regions of the seed layer are plated to fill the via with metal and form a metal plug. The blocking layer and unplated seed layer are removed and a second dielectric layer is formed over the metal plug. A metal routing layer is then formed over the second dielectric area, such that the metal routing layer contacts the metal plug through the second dielectric layer to form an electrical connection.

It will be appreciated by those skilled in the art with the benefit of the present disclosure that the process steps described above can be modified without departing from the invention. That is, process integration changes can be made to adapt to equipment, semiconductor device parameters and process concerns of a manufacturer.

Figure 15:
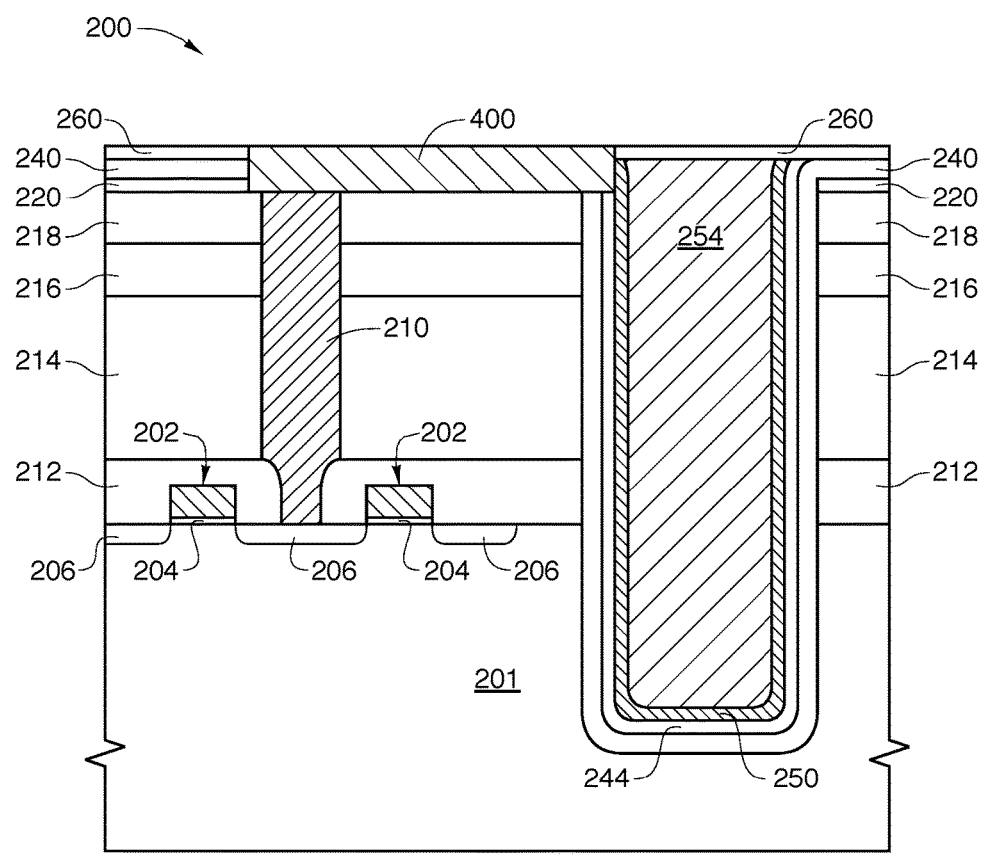
FIGS. 15-16 are partial cross-section views of a simplified in-process semiconductor according to embodiments of the invention.
Figure 16:
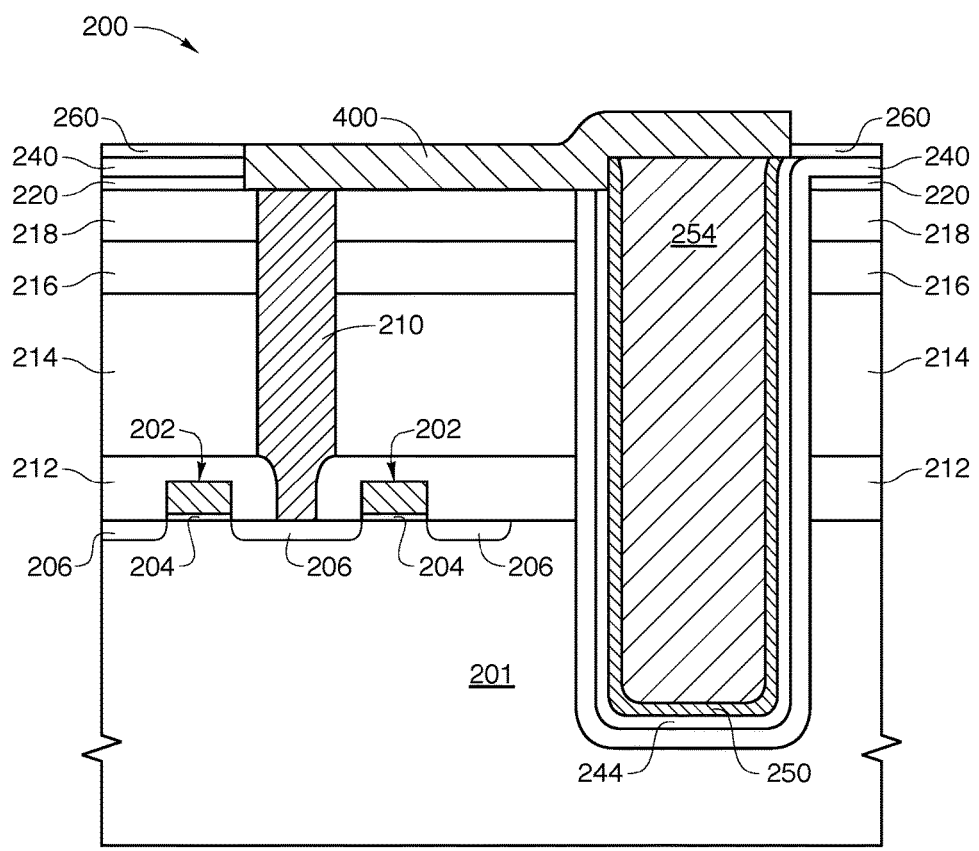

Referring to FIGS. 15-16, alternate embodiments are illustrated. In these embodiments the damascene process used to form the metal routing layers are used to enable electrical direct contact between the metal 1 layer and the metal interconnect directly. For example, as shown in FIG. 15 the etch operation exposed the metal interconnect 254 and removed the barrier layer on the vertical sides of the seed layer 250 so that metal 1 layer 400 contacts the interconnect. After planarization the metal 1 layer is integrally connected to the metal interconnect. Alternately, the etch operation can expose the metal interconnect 254 and removed the barrier layer on the vertical and top sides of the interconnect so that metal 1 layer 410 contacts the interconnect 254 on the top surface, see FIG. 16.

Alternative embodiments of the present invention include forming the metal interconnect following formation of a metal routing layer, but prior to formation of a final metal routing layer. In addition, metal interconnects can be formed between the formation of metal layers. That is, the invention is not limited to one metal interconnect formation operation.

Embodiments of the invention are not limited to two metal routing layers. Further, a portion of any, some, or all of the metal routing layers can be electrically connected to the metal interconnect. That is, a semiconductor device may include hundreds of metal interconnects each designated for a different operational purposes. Therefore the electrical path(s) of the interconnects can and most likely will be different.

Figure 17:
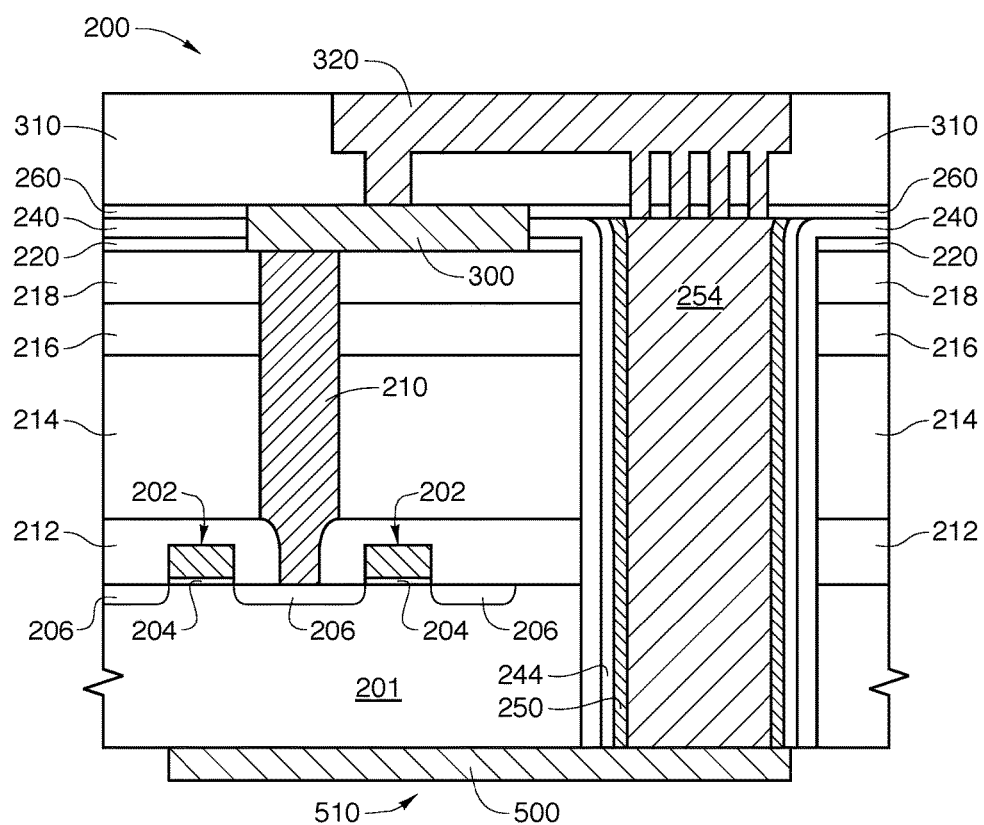
FIG. 17 illustrates a partial cross-section view of a simplified in-process semiconductor with a redistribution layer according an embodiment of the invention.

FIG. 17 illustrates a redistribution layer 500 which can include ball bond pad location(s) 510 is formed on the back, or bottom, of the semiconductor substrate following exposure of the metal interconnect 254. The redistribution layer forms electrical and physical contact with the interconnect. Fabrication processes for thinning a semiconductor wafer and forming redistribution layers are well known in the art. As such a detailed description is not provided herein.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of fabricating a semiconductor device comprising:
    etching a via into a silicon substrate from a first side toward a second side of the silicon substrate;
    forming a conductive interconnect in the etched via, the conductive interconnect having a first end proximate the first side of the silicon substrate and a second end proximate the second side of the silicon substrate;
    insulating the conductive interconnect with a first dielectric material proximate the first side of the silicon substrate;
    forming a first metal routing structure on the first dielectric material, the first metal routing structure being at least partially in the first dielectric material;
    insulating the conductive interconnect and the first metal routing structure with a second dielectric material;
    forming a plurality of openings in the second dielectric material, the openings including a first opening generally corresponding to the first metal routing structure, a second opening generally corresponding to the conductive interconnect, and a third opening generally corresponding to a second metal routing structure; and
    filling the plurality of openings with a conductive material, thereby forming a first conductive path between the first and second metal routing structures, a second conductive path between the second metal routing structure and the conductive interconnect, and the second metal routing structure.

2. The method of claim 1, further comprising:
    forming an insulating material in the etched via;
    forming a seed material on the insulating material;
    blocking selected regions of the seed material located outside of the via with a photoresist; and
    plating exposed regions of the seed material to fill the via with a conductive material, thereby forming the conductive interconnect.

3. The method of claim 1, further comprising:
    fabricating a transistor having a gate and source/drain implant regions in the silicon substrate.

4. The method of claim 3, further comprising:
    forming an insulating material on the silicon substrate with the fabricated transistor; and
    forming a contact coupled to the transistor.

5. The method of claim 4, further comprising etching the via into the silicon substrate laterally adjacent to the transistor.

6. The method of claim 4, further comprising extending the via deeper into the silicon substrate than the source/drain implant regions of the transistor.

7. The method of claim 4, further comprising forming the contact generally parallel to the conductive interconnect.

8. The method of claim 1, further comprising forming the first conductive path generally parallel to the second conductive path.

9. The method of claim 1, further comprising forming the first conductive path generally parallel to the conductive interconnect.

10. The method of claim 1, further comprising forming the second conductive path generally parallel to the conductive interconnect.

11. The method of claim 1, further comprising forming the second metal routing structure generally perpendicular to the conductive interconnect.

12. The method of claim 1, further comprising forming the second metal routing structure generally parallel to the first conductive path.

13. The method of claim 1, further comprising forming the second metal routing structure generally parallel to the second conductive path.

14. The method of claim 1, further comprising forming the first metal routing structure laterally spaced apart from the conductive interconnect.

15. The method of claim 1, further comprising:
    removing a portion of the second side of the silicon substrate to expose the second end of the conductive interconnect; and
    forming a conductive redistribution structure proximate the second side of the silicon substrate and electrically coupled to the conductive interconnect.

16. The method of claim 15, wherein the conductive redistribution structure comprises a conductive ball bond pad.

17. The method of claim 1, wherein the conductive interconnect has a length to width ratio of about 5:1 to 10:1.

18. A method of fabricating a semiconductor device comprising:
    etching a via into a silicon substrate from a first side toward a second side of the silicon substrate;
    forming a conductive interconnect in the etched via, the conductive interconnect having a first end proximate the first side of the silicon substrate and a second end proximate the second side of the silicon substrate;
    insulating the conductive interconnect with a first dielectric material proximate the first side of the silicon substrate;
    forming a first metal routing structure on the first dielectric material, the first metal routing structure being at least partially in the first dielectric material;
    insulating the conductive interconnect and the first metal routing structure with a second dielectric material;
    forming a first opening generally corresponding to the first metal routing structure;
    forming a second opening generally corresponding to the conductive interconnect;
    filling the first opening with a conductive material to form a first conductive path;
    filling the second opening with the conductive material to form a second conductive path generally parallel to the first conductive path;
    electrically coupling the first conductive path and the second conductive path via a second metal routing structure.

19. The method of claim 18, further comprising:
    forming a third opening generally perpendicular to the first conductive path and the second conductive path;
    filling the third opening with the conductive material to form the second metal routing structure.

20. The method of claim 18, further comprising:
  removing a portion of the second side of the silicon substrate to expose the second end of the conductive interconnect; and
  forming a conductive redistribution structure proximate the second side of the silicon substrate;
  electrically connecting the conductive redistribution structure with the conductive interconnect.

21. The method of claim 18, wherein the conductive redistribution structure comprises a conductive ball bond pad.

\* \* \* \* \*